United States Patent [19]

Wolf et al.

[11] Patent Number: 5,287,363
[45] Date of Patent: Feb. 15, 1994

[54] SYSTEM FOR LOCATING AND ANTICIPATING DATA STORAGE MEDIA FAILURES

[75] Inventors: Paul I. Wolf, San Diego; Norman B. Ivans, La Jolla, both of Calif.

[73] Assignee: Disk Technician Corporation, San Diego, Calif.

[21] Appl. No.: 723,942

[22] Filed: Jul. 1, 1991

[51] Int. Cl.$^5$ .............................................. G01R 31/28
[52] U.S. Cl. ...................................... 371/21.1; 360/53; 371/4; 371/40.1; 371/62
[58] Field of Search ......................... 371/21.1, 40.1, 62, 371/4, 13, 10.2, 21.6; 360/31, 53

[56] References Cited

U.S. PATENT DOCUMENTS

| | | | |
|---|---|---|---|
| 3,191,153 | 6/1965 | Bratschi et al. | 371/62 |
| 3,805,152 | 4/1974 | Ebersman et al. | 371/62 |
| 4,112,502 | 9/1978 | Scheuneman | 371/4 |
| 4,748,627 | 5/1988 | Ohsawa | 371/40.1 |
| 5,157,666 | 10/1992 | Chen et al. | 371/21.1 |

FOREIGN PATENT DOCUMENTS 0164673 12/1985 European Pat. Off. .
2202976 10/1988 United Kingdom .

OTHER PUBLICATIONS

Disk Technician Gold User Guide, Version No. DTG01013, Disk Technician Corporation, San Diego, California, 1991-1993, Appendix D, pp. D1-D12.
Byers, T. J. et al., "The Complete Hard Disk Tool Kit", PC World, Jul. 1993, pp. 158-161, 164-165, 168, 177-179.
Patent Abstracts of Japan, vol. 12, No. 119, p. 689, published Oct. 26, 1987, abstract of JP 62-245443.
Patent Abstracts of Japan, vol. 12, No. 255, p. 732, published Feb. 25, 1988, abstract of JP 63-44375.

*Primary Examiner*—Charles E. Atkinson
*Attorney, Agent, or Firm*—Wolf, Greenfield & Sacks

[57] ABSTRACT

Method and apparatus for use in a computer having peripheral data storage, to monitor data transfers to detect defective or marginally defective storage areas. The method and apparatus are based on a memory-resident program component and a transient program component which cooperate. The resident component is in the computer's interrupt chain, to be invoked during both the initiation and conclusion of storage operations. When a data access is called, a timer (e.g., the system timer) provides interrupts at a suitably high rate, and informs a second component of the operation. At the conclusion of the operation, error indications are logged into a log file. The second component accumulates interrupts during the operation, and monitors one or more memory addresses. For each monitored address, when its contents first change, the second component stores the current interrupt accumulation. Following the operation, the first component applies algorithms to the accumulations and decides thereby whether to log an error indicator. A third component places the first component in the storage call chain in one of two positions, including a preferred position providing raw status rather than processed status with some information removed. An analysis program retrieves the log entries, clears the log for future entries, adds the entries to a history of the storage, and applies algorithms to the history to determine whether storage areas are defective. It also takes remedial action such as marking a defective storage area bad and relocating the data to a usable area.

62 Claims, 7 Drawing Sheets

SYSTEM FOR LOCATING AND ANTICIPATING DATA STORAGE MEDIA FAILURES

CROSS REFERENCE TO RELATED APPLICATIONS

This application is filed copending with, and claims the benefit under 35 U.S.C. §120 of, U.S. patent application Ser. No. 07/609,840, filed Nov. 5, 1990 and titled "System For Locating and Anticipating Data Storage Media Failures."

BACKGROUND OF THE INVENTION

1. Field of the Invention

This invention relates in general to systems which operate in real time to monitor data retrieval operations of peripheral storage media and log events indicating the occurrence of any difficulty in retrieving data, and which subsequently, not in real time, take remedial action based on analysis of the logged data. The invention relates more specifically to systems which perform the aforementioned functions in microcomputer or personal computer environments.

2. Prior Art

Currently, there are computer programs for testing computer peripheral storage media, particularly rotating magnetic storage, to determine whether there are areas that are bad or marginal with respect to storing data with integrity. A large majority of these programs accomplish the task by writing and reading areas of a storage medium repeatedly to determine the reliability of the areas. If an area does not meet some selected threshold of reliability, then the area is marked bad according to the procedures of the operating system, and data is relocated if possible. Common to such conventional programs is the fact that, except in context switching environments, they must be run as separate, stand alone programs with no other programs (other than the operating system) running concurrently. In other words, normal computer operations must be suspended while these programs are run to test the storage medium. This is wasteful of time and resources, and the requirement that they be run alone dictates that they do not test a storage medium in the actual program environments in which it is normally used. Moreover, many conventional test programs require that most or all memory-resident programs and data storage caching be removed or disabled before testing. So, in fact, the tests are done in a simulated program environment. Also, the physical environment is very often different since the tests are typically run at times when the computer is not performing its usual functions. For example, in a business office, the tests are typically run during non business hours to avoid interfering with business operations. Unfortunately, line power to the computer may have different characteristics at those times, and ambient temperature and humidity may be different, all of which may have an effect on the performance of the storage medium under test. So, there is great advantage in being able to monitor the data storage performance of the medium in its normal operating environments.

Another disadvantage in conventional test programs which is overcome by the system of this invention arises as a result of conventional storage medium controller retry strategies in personal computers. For example, in a personal computer, if in a first attempt a conventional storage medium controller is unable to retrieve a block of data without a data error, it will retry the data retrieval operation one or more times. These retries may be very significant indications of defective or marginal areas of the medium, but the retries are completely hidden because they are not reported to the operating system. Thus, conventional programs do not have ready access to one of the best sources of information on media quality.

However, it has been found that read retries can very often be detected by a program by making certain time measurements of data retrieval operations. Although most personal computers provide a system timer for making time measurements, it is very difficult to measure accurately the time duration of data retrieval. Some of the conventional programs described above, which operate on personal computers and which suspend normal operations while being executed, measure the total elapsed time for a disk read operation by counting or accumulating conventional system timer interrupts. However, the rate of such interrupts in a typical personal computer is too low to make accurate measurements, since a typical single access time might be half the time between interrupts, or less. In an attempt to make more accurate measurements, some conventional test programs read the contents of the system timer counter at the start and end of an operation. These programs may first disable the system timer, look at the contents of the timer counter, start the data retrieval operation, and at the end of the data retrieval operation will again look at the contents of the timer counter. This method may provide more accurate timing information than simply counting conventional system timer interrupts, but only the total elapsed time of the data retrieval operation can be measured in this manner.

A significant problem with both of these conventional methods lies in the fact that a data retrieval operation may exhibit some rotational latency time and may also include seek latency time. In other words, a measured elapsed time could include the time it took for the storage controller to position a read head over the area of the medium from which the data was read. It then becomes necessary to separate out the rotational and/or seek latency time from the actual data read time. Distinguishing between the actual read time and the latency time can be accomplished to a limited extent in a conventional test program by conducting seekless read operations, however, this requires that normal functions of the computer be suspended while the test program runs special disk read operations. Therefore, and also since some problems which may be aggravated by seek operations are not brought out, these reads are not representative of actual operating conditions. So, there is great advantage in being able to measure the time duration of data retrieval operations which occur while the computer is performing its usual functions and being able to accurately distinguish seek and rotational latency times from actual read times. Heretofore, personal computer operating systems and applications software have not included program-based systems which had the capability of measuring the read time portion of a data retrieval operation.

Some conventional storage medium controllers have the capability of correcting a limited number of data errors. Typically they employ an error correction code (ECC) which is recorded along with the data. When the data is retrieved, this code is used to correct data errors within its capability. The fact that the controller had to employ the error correction code to correct data during a data retrieval operation may, for disk drives, be a very strong indication that the area or areas from which the data was read are defective or marginally defective; for other disk drives, the ECC is invoked very frequently, as a routine matter, and the fact that it was employed on a particular read operation is of no consequence. Controllers employing ECC typically report to the operating system that an error correction has taken place, but most operating systems used on personal computers do not pass that information on to user programs. So conventional test programs, being user programs, have no way of knowing whether or not error correction activity has taken place with respect to a read operation. Since information regarding ECC activity can be very valuable in evaluating the storage capability of a medium, it would be very advantageous, in such systems, for a test program to have access to information indicating whether or not an error correction operation had taken place.

SUMMARY OF THE INVENTION

According to a first aspect, the invention presents a system (i.e., apparatus, and application provided on a tangible medium, such as a disk, for use with a computer system to form the apparatus and practice the related method) which has a memory resident part that monitors data retrieval from a peripheral storage medium concurrently with the normal operation of the computer. The monitoring includes, without limitation, making time measurements of data retrievals much more accurately than conventional test programs, and may also include checking for indications that an error correction has taken place. If there are any un correctable errors, corrected errors, retries, or such, the system of the present invention logs them into a file for later analysis by a non memory resident part of the system. This monitoring and logging is transparent to normal operations of the computer system and does not interfere with normal computer operations.

Another, non memory resident part of the system of this invention retrieves data logged by the memory resident part, assembles the logged data into a history of the medium per unit area, e.g., per sector, and analyzes the historical data to determine whether there are any areas of the storage medium that are unable to store data with integrity or are tending to lose the ability to store data with integrity. If any areas are determined to be bad or to be marginally bad as a result of the analysis performed by this part, the non memory resident part relocates to other areas the data stored in these areas, if possible, and marks original areas bad according to the procedures of the operating system under which the non-memory resident part is running.

The non-memory resident part can be executed each time the computer is powered up or re-booted, for example, or it can be run any time an operator so chooses, but the memory resident part is in operation any time the computer is operating, monitoring data retrieval and logging problem indications.

According to a second aspect of the invention, to facilitate the operation of the memory-resident part, there is provided apparatus and a method which selectively forces the interrupt vector for a program, such as the memory resident part of the present invention, to the head of the chain of interrupt vectors, as needed, upon the occurrence of a specified condition. The interrupt vector may be maintained there even when other programs try to supplant it.

BRIEF DESCRIPTION OF THE DRAWINGS

Advantages and attributes of this invention will be readily discernible upon a reading of the text appearing below, in connection with the drawing, wherein like elements are identified by like reference designations.

DETAILED DESCRIPTION

For purposes of this specification and the claims, the following definitions shall apply. The term "memory-resident" when it refers to a computer program or routine (a subset of a program) shall mean that the program and routine once loaded into computer memory remains resident in said memory under normal operating conditions. The term "transient" when it refers to a computer program or routine shall means that the program and routine when loaded into computer memory remains resident only until the program or routine is terminated. When a program is described as having "program control" it shall mean that the program is the program being currently executed by the central processing unit ("CPU"). The terms "hard disk" and "disk" shall refer to data storage media such as magnetic disks, optical disks and their functional equivalents. A "read" or "read operation" refers to a data retrieval disk operation. The term "DOS" shall refer to PC-DOS, MS-DOS, DR DOS and the like, which are registered trademarks or trademarks of International Business Machines Corporation, Microsoft, Inc., and Digital Research, Inc., respectively, for their personal computer disk operating systems.

Figure 1:
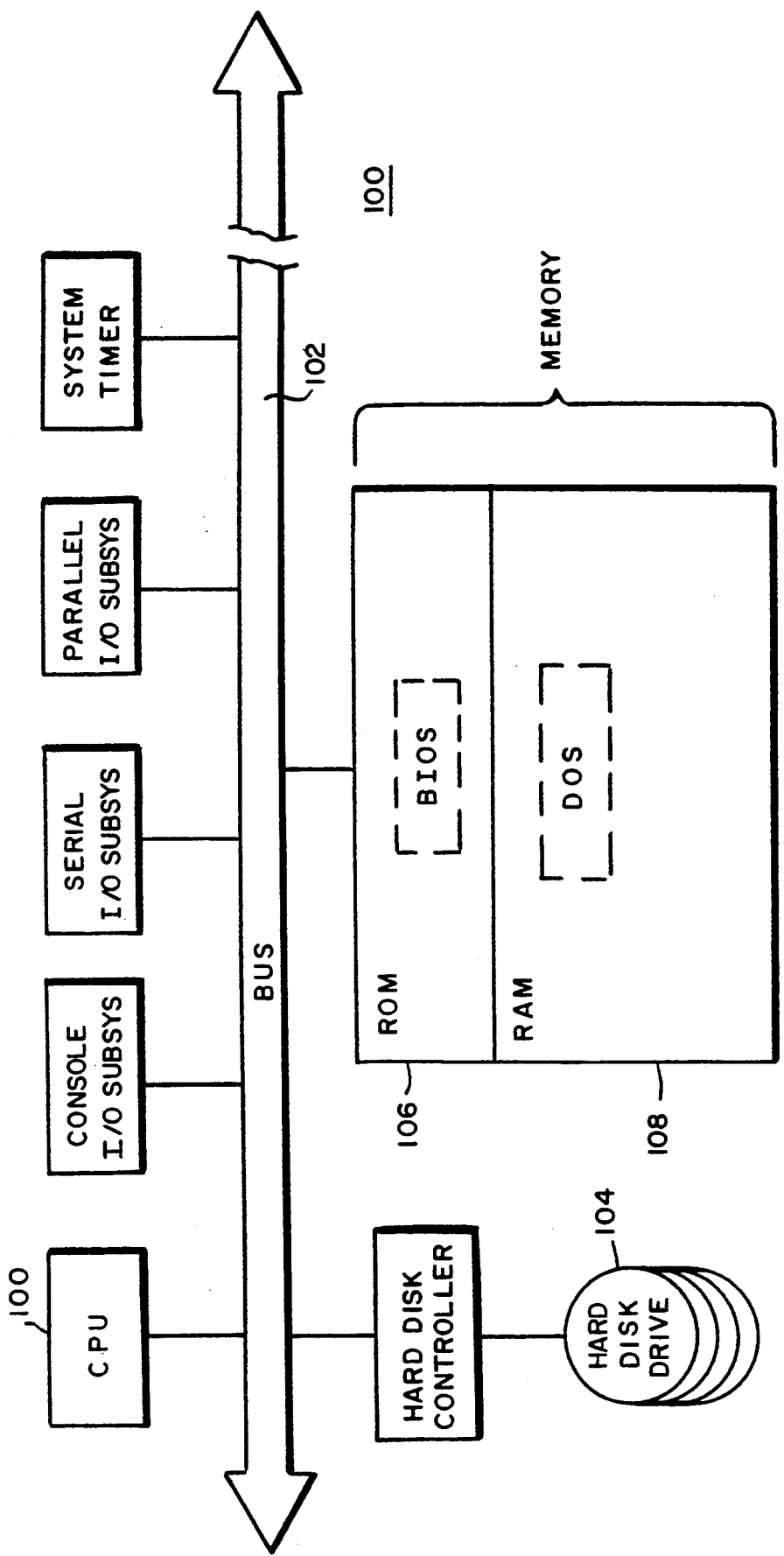
FIG. 1 is a block diagram of a typical computer system in which the present invention may be used.

Although the preferred embodiment described herein includes a computer program operating on a personal computer, such as an IBM PC-compatible computer using DOS as its operating system, a computer program according to the present invention may be made to operate on other types of computers and with other operating systems, as well. A simplified block diagram of a generic personal computer 100 such as is used in the preferred embodiment is given in FIG. 1. In this type of computer, a variety of components and subsystems are connected together by a bus 102, so that they may communicate electrically with each other.

Instructions directing such a computer to perform useful work are contained in a computer programs, which may be stored in an "external" medium such as on the hard disk 104, or internally in a read-only memory (ROM) 106, for example. If the computer program is stored on a hard disk or another external medium, the instructions are loaded into the random access memory (RAM) 108 before they can be executed by the central processing unit (CPU) 110. A certain group of instructions or computer programs, which perform such administrative functions as loading a program in response to a user's command, or making a hard disk access, are known collectively as an operating system. The type of operating system with which the preferred embodiment of the present invention is concerned is DOS, as defined earlier; however, other suitable operating systems for use with personal computers and other microcomputers are known in the art.

The CPU is the component which executes, or carries out, the instructions comprising a computer program, as indicated above. In personal computers, the CPU generally is capable of performing only one instruction at a time, in the sequence directed by the program in RAM. However, the CPU operates at extremely high speeds, while many of the other subsystems of a personal computer must perform much slower physical operations. For example a hard disk drive may need to move its read/write head to a particular location to retrieve needed data. Thus, a system of interrupts is provided as part of the bus structure of a personal computer, so that the program presently executing may be "interrupted" to perform some special task, such as servicing the hard disk drive by receiving data recently retrieved.

Interrupts may also be issued by a program presently executing, through software commands. This allows a computer program to request a DOS service such as reading a sector from the hard disk, simply by issuing the correct interrupt.

Personal computers operate at a wide variety of speeds. However, many computer programs, such as arcade-style games for example, are required to operate in real time. That is, they must be fast enough to provide program output which can modify input events. Thus, a popular component of most personal computers, today, is a system timer. This is a device which simply counts (and signals) time in known units. As will be seen hereinafter, the known units for IBM-compatible personal computers are "ticks" of 55 milliseconds (msec.), although the time between ticks is programmable. If a computer program requires longer or shorter ticks, that program may load a value into a register within the timer by methods known in the art, which will cause the timer to tick at a different rate. Each tick of the system timer is communicated to the rest of the system by means of a so called "timer interrupt", which might more rigorously be called a "timer generated interrupt", since it is the processor, not the timer, which is interrupted.

Figure 2:
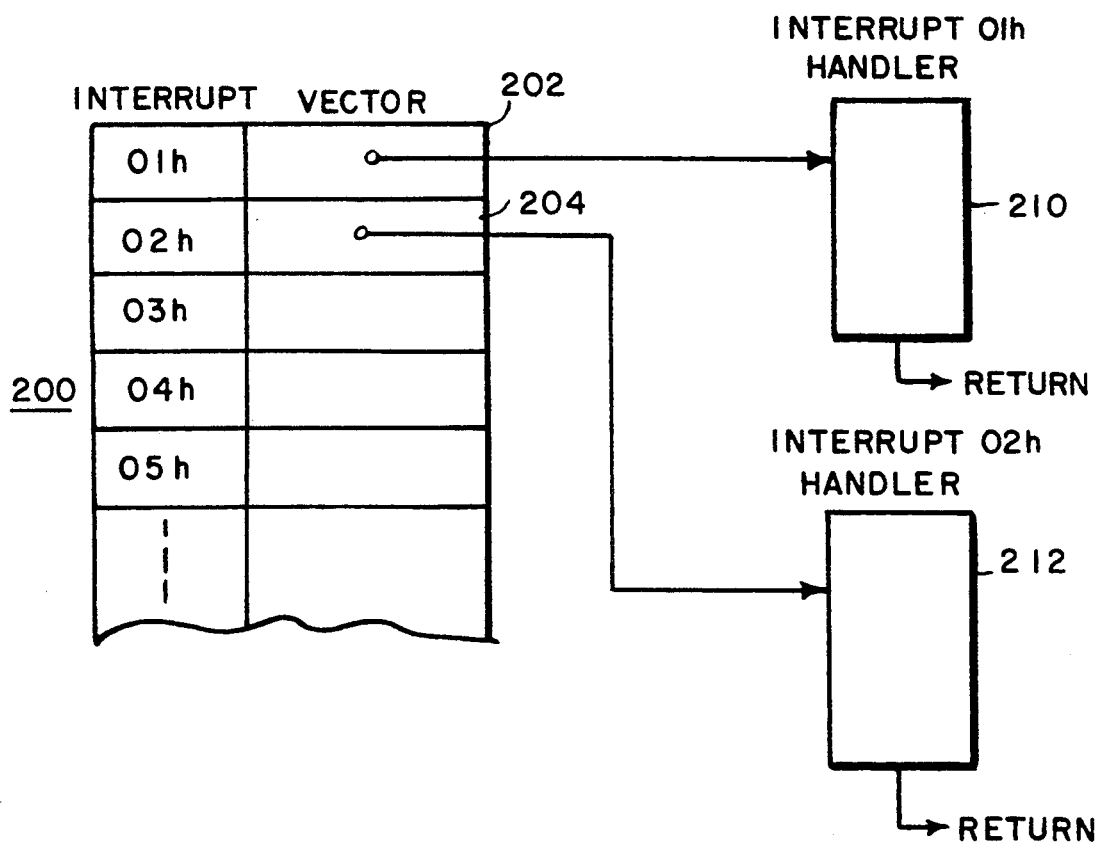
FIG. 2 is a diagrammatic illustration of an interrupt vector system such as is used in personal computers.

Having set forth a brief description of the hardware environment of the preferred embodiment, the interrupt structure will now be described in more detail with reference to FIG. 2.

Although hardware and software interrupts are initiated differently, they proceed in a similar manner. A hardware interrupt is initiated by one of several dedicated signals communicated on the bus 102 of FIG. 1, while a software interrupt is initiated by an instruction similar to a call to an operating system function. In both cases, control is transferred to an address found in a table of interrupt vectors 200, wherein the interrupt number is the index into the table. In DOS, for example, this table is preferably maintained by the operating system. Each entry in the table contains a pointer to an address (i.e., it contains the value of an address where other information will be found). At the addresses pointed to by the interrupt table are one or more interrupt handlers, e.g., 210 and 212, which are routines for processing the interrupts. On completion, the interrupt handlers execute a return instruction which causes control to return to the previously executing process.

The table 200 contains one interrupt vector, or address (e.g., 202, 204) to transfer control to, for each possible interrupt. Thus, if more than one program wishes to install a handler for a particular interrupt, it becomes the responsibility of each program to call any previously installed handler which it supercedes. However, if all programs using interrupt handlers follow this simple protocol, interrupt chains may be built as described below in connection with the present invention.

Figure 3:
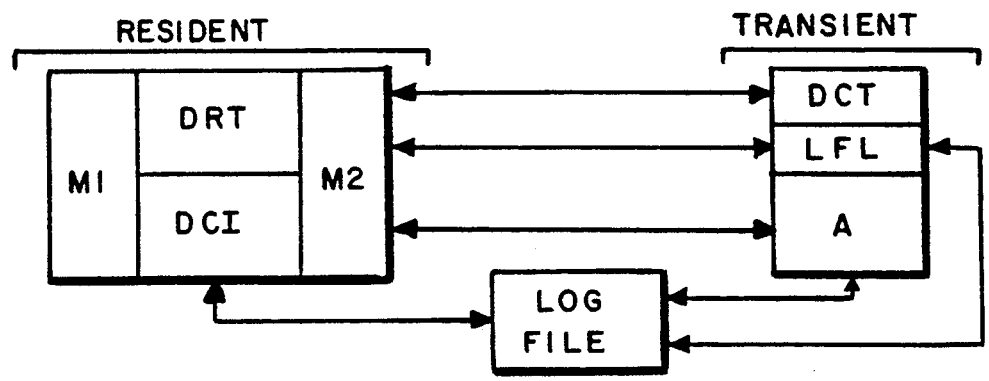
FIG. 3 is a functional block diagram of the components of this invention and their respective communication paths.

There are several major components of this system, including hardware components described briefly hereinabove, and software components described below. FIG. 3 illustrates the software components and certain important characteristics and relationships. Under the "resident" heading, there is one component labeled "DRT" for "disk read timer," and another component labeled "DCI" for "disk call interceptor." These two components are memory-resident components. They share common variables in a memory, M1, which is private to them, that is, it is not readily accessible to other programs. They also can read and write to a structured memory block M2 which can be accessed by the transient components of this system. The double ended arrows between M2 an the transient components indicate this sharing of the structured memory M2.

Referring again to FIG. 3, under the "transient" heading, there is a component labeled "DCT" which stands for "disk-call trapper," a component labeled "LFL" for "log file locator" and a component labeled "A" for "analysis." These transient programs are not memory resident at all times. The disk-call trapper and the log file locator both perform set-up functions then terminate. The analysis component can be executed automatically when the computer is powered-up or re-booted. In a DOS environment for example, this may be accomplished by entries in files known as AUTOEXEC.BAT and CONFIG.SYS. The analysis component, however, must be executed after the set-up components. Preferably, all of the transient components are contained in one program module.

Referring again to FIG. 3, it is the general function of the resident components to monitor disk reads. A primary function of the disk-read timer is to measure the time duration of data transfer during disk read operations. In order to accomplish the above, primary function, the disk read timer will "place" itself at the "head" of a system timer interrupt chain and maintain that position against other programs that may try to supplant it. A primary function of the disk-call interceptor is to gather information indicative of disk data read problems and to log that information onto the log file. It principally gathers the data transfer time measurements from the disk-read timer and information from the status returned by the disk low level interface routine. From the time measurements it detects data transfers that took an excessive amount of time which would indicate that the data was not successfully read on a first attempt, and one or more retries at reading the data was conducted by the disk controller and/or the operating system's low-level interface to the disk. Secondarily, the disk-call interceptor may temporarily relocate to a location accessible to the analysis program data which took an excessive time to read.

Referring again to FIG. 3, a primary function of the analysis program is to take the events recorded by the disk-call interceptor on the log file, build and maintain a history of such events sorted by disk unit areas, such as sectors, apply certain algorithms to the historical data, take remedial measures and/or communicate with a computer operator whenever application of the algorithms to the historical data indicates a failure mode, an unknown defective area or an area that has become marginally defective. Remedial action can include moving to a good area the data, which was stored in an area accessible to the analysis program by the disk-call interceptor, as described above, and marking the bad or marginally defective area in the disk's list of such areas.

Referring again to FIG. 3, a primary function of the log file locator is to provide the absolute disk address of the log file to the memory-resident components. Preferably, the memory-resident components are a single program module in the form of a low-level device driver which is part of the operating system. In an operating system that is not re-entrant, the device drivers do not have access to the operating system's file management services, since they are part of the operating system. Therefore, the resident components must know the absolute disk address of the log file in order to safely write into the log file.

Referring again to FIG. 3, the primary function of the disk-call trapper is to functionally place the disk-call interceptor in the operating system's disk call chain so that the disk-call interceptor is invoked for each disk operation. The disk-call interceptor needs to be in the disk-call chain in order to distinguish disk read operations from other disk operations before they start, and in order to obtain the status information concerning the disk-read operations which is available at their conclusion or abortion. Once the disk-call interceptor is properly placed within the disk-call chain, the disk-call trapper is no longer needed.

Each of the various components of a system according to the present invention is now described in greater detail.

DISK READ TIMER

As previously discussed, one component of the system according to this invention is the disk-read timer which measures which the duration of data transfers during disk read operations.

Computer systems typically have a system timer, as described briefly above, which provides timer interrupts ("ticks") at regularly timed intervals for use by programs which have timed events. Conventionally, the ticks are generated by a counter circuit which divides down a system clock rate to provide ticks at a rate suitable to user programs. For example, in Intel 8086-, 8088-, and 80×86-based personal computers running DOS, the system timer tick rate is conventionally one tick per fifty five milliseconds (1 tick/55 msec.) Conventionally associated with the timer interrupt is a known, fixed memory location for containing a preset timer interrupt vector ("TIV"). When a timer interrupt occurs and is not masked, the CPU suspends execution of the currently executing program, and program control is transferred to a memory address which uniquely corresponds to the contents of the timer interrupt vector. Under normal conditions the contents of the vector is a pointer to an entry point of a timer interrupt handler ("TIH") routine.

In computer systems which have only one timer interrupt vector, there can be contention between two or more memory resident programs which require timer interrupts. Moreover, it is valid for any resident program to replace the contents of the TIV with a vector pointing to its own timer interrupt handler, but in doing so, the program must accept responsibility for passing on the tick to the program whose vector has been supplanted. When a timer interrupt occurs, the program must call the replaced vector either before or after it has completed its own timer interrupt processing. In response to a tick, the program typically performs some processing in response to the interrupt and either returns program control back to the program that was interrupted, at the point of interruption, so that the interrupted program can resume its operation, or it passes the interrupt onto a second program occupying a subordinate position in the tick chain. The second program again typically does some processing in response to the tick and then either returns control to the interrupted program or passes the tick on to a third program occupying a further subordinate position in the tick chain. At some point, all of the programs in the timer interrupt hierarchy, i.e., programs in the tick chain, have received and processed the tick, and program control is restored to the interrupted program. In this way a timer interrupt chain can be built, the chain comprising a plurality of TIHs in hierarchical order.

Figure 4:
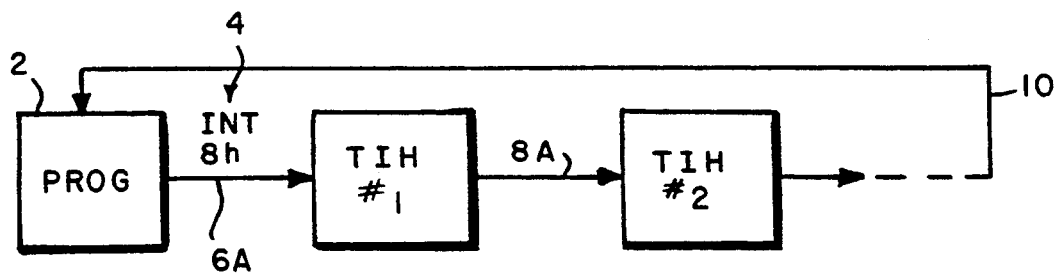
FIG. 4 is a functional block diagram illustrating program control flow in a timer interrupt chain without this invention present.

For example, a first program can set the TIV to point to its own timer interrupt handler and thereby assume first place in the chain. Then when a tick occurs, the first program's timer interrupt handler is informed of the interrupt, i.e., called, first before any other TIHs in the chain. A second program seeking first place in the chain can change the state of the TIV to point to its own timer interrupt handler. In this way, it supplants the first program in the primary priority position in the interrupt hierarchy. In order to avoid interfering with the operation of the first program, the second program must save the interrupt vector of the first program, and when the second program completes its interrupt processing, it must pass the tick to the first program, typically by branching to the saved vector. Program control flow in a timer interrupt chain can best be described using illustrations. Referring to FIG. 4, a functional block diagram illustrating the transfer of program control in response to timer interrupts in a typical conventional computer system is presented. A currently executing program 2 has program control until a timer interrupt 4 occurs. (For reference purposes only the interrupt is designated "INT 8h" which corresponds to a common designation of a DOS timer interrupt.) For each timer interrupt 4, program control is directly transferred via path 6A through the TIV, which in this case points to TIH #1. As long as the TIV continues to point to TIH #1 it will be given program control directly for each timer tick. TIH #1 can be said to be at the head of the timer interrupt chain. Also in the chain is TIH #2 which is in subordinate position to TIH #1 since it must rely on TIH #1 to propagate the tick to it. This chain could have resulted from a situation in which TIH #2 originally had control of the timer interrupt vector and as therefore at the head of the chain, but subsequently the TIV was appropriated by the TIH #1 by changing the TIV to point to TIH #1. According to proper procedure, TIH #1 also saved the supplanted vector which points to TIH #2. So when TIH #1 receives a tick and has finished its tick processing, it passes the tick to TIH #2 via path 8A by passing program control to TIH #2 via the supplanted vector. When TIH #2 has completed its interrupt processing, it either passes the tick to the next TIH in the chain, or if there are none, then it simply does an interrupt return which returns program control to the interrupted program via path 10.

The disk-read timer measures the duration of data transfers by counting system timer ticks, so that it must be in the timer interrupt chain as a TIH with other TIH's, if any. Conventional tick rates are not sufficient for accurate measurements so the tick rate is increased, at least during read operations, as will be explained, by the disk-call interceptor. In order that the increased tick rate not adversely affect the operation of other programs, the disk-read timer must be the first TIH to receive the ticks, i.e., at the head of the chain. In this position the disk read timer can control the rate of ticks received by the other TIHs in the chain. When the tick rate is normal (i.e., provided at a conventional rate), the disk read timer passes every tick down the chain, but when the tick rate has been increased it passes down ticks only at the normal rate, blocking all extra ticks from the rest of the chain.

Figure 5:
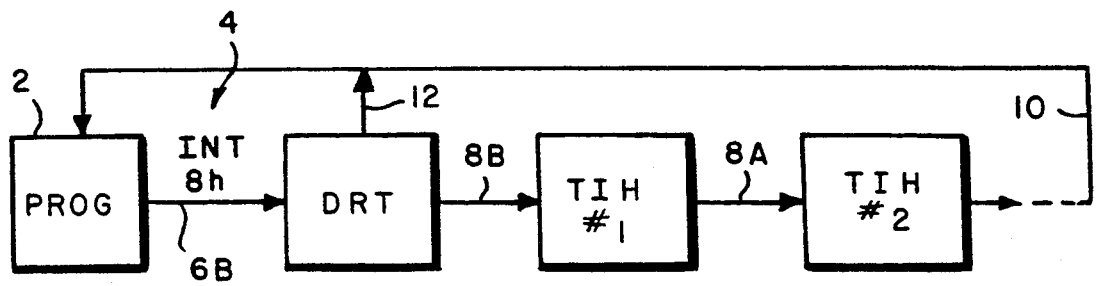
FIG. 5 is a functional block diagram showing program control flow in a timer interrupt chain in which a disk-read timer component of this invention is present at the head of the chain.

Referring to FIG. 5, the interrupt chain of FIG. 4 has been altered by the presence of the disk-read timer ("DRT"). The disk read timer is now at the head of the timer interrupt chain. It did this by appropriating the TIV from TIH #1 by changing the TIV to point to the disk-read timer and saving TIH #1's timer interrupt vector which points to TIH #1. As previously explained in this example, it was TIH #1 which appropriated the TIV from TIH #2 and saved TIH #2's vector. Thus when a timer interrupt occurs, the tick is passed along the chain in the same process as described in connection with FIG. 4 except that now the disk read timer gets the tick first via path 6B. There is, however, one very significant difference. During read operations, the timer tick rate is increased to enhance the ability of the disk-read timer to time the data transfer of the read operation. The disk read timer still gets every tick, but it propagates only every Nth tick down the chain via path 8B, bypassing the rest of the chain via path 12 for all other ticks, "N" being the factor by which the timer tick rate is increased by the disk-call interceptor during disk read operations.

The disk-read timer is a memory resident program. It can remain in memory as a terminate-and-stay resident ("TSR") program, but preferably is loaded and remains in memory as part of a "device driver." A device driver appears to the operating system as a low-level program which functions as an interface between the operating system and a peripheral device. When a device driver is initially loaded into program memory, the operating system conventionally calls (i.e., transfers program control) to the device driver and gives it a command to "initialize." This basically informs the device driver that it has just been loaded and gives it an opportunity to perform any necessary setup functions.

Figure 6:
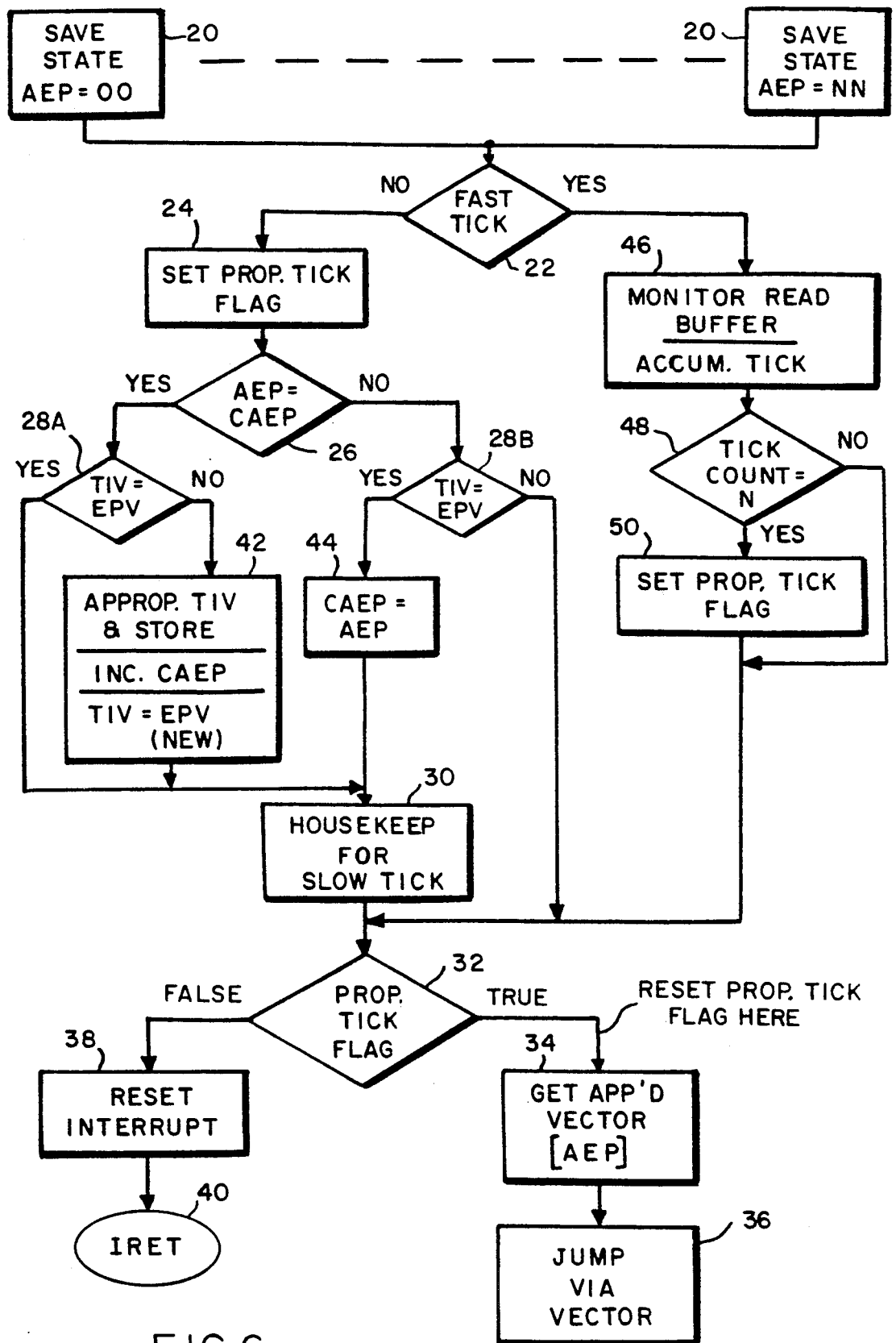
FIG. 6 is a functional flow diagram illustrating major functions and decisions performed by a disk-read timer component of this invention.

Referring to FIG. 6, the disk-read timer has a plurality of entry points ("EP") 20. When it is initially loaded into program memory, the disk-read timer initializes itself by selecting the first entry point from a table of entry points and appropriates the TIV. It appropriates the TIV by first storing the contents of the TIV in a table of that corresponds to the level of the selected EP, and secondly by altering the TIV to contain a vector pointing to the selected EP. An index means common to both tables is used as a pointer to the selected EP and the vector it displaced, its corresponding appropriated vector. Preferably the index means is a memory or memory location used for storing the table level of the selected EP (and its appropriated vector since it is stored in the appropriate vector table at the same level), and as such the contents of the index means is a unique identifier of the currently selected, i.e., active, entry point. For purposes of reference only, the contents of the index means will be referred to as the "CAEP" for "currently active entry point."

From this point on, unless the TIV is subsequently altered by another program, all timer interrupts will vector program control to an entry point having an identifier equal to the CAEP. However, as previously mentioned, there are situations in which the TIV can be altered by other resident programs, and the disk read timer must contend with them. There must be at least one entry point for every other resident program which may or does alter the state of the TIV. Each time it is entered, the disk read timer must determine the state of its position in the timer interrupt chain from among a plurality of possible states.

Referring again to FIG. 6, each entry point 20 when entered saves the state of the machine and places an identifier, such as a number uniquely associated with that entry point, into a known memory location ("AEP" for actual entry point). This identifier can be the relative address of the EP in the EP table. In this way the disk read timer has a record of the identity of the actual EP. A flag signifying that the tick rate has been accelerated is interrogated at 22. This flag is set by the disk-call interceptor when a disk read operation has started. If the flag is false then the disk read timer takes steps to remain in first place in the timer interrupt chain. A "propagate tick" flag is set at 24, and the disk-read timer then examines the state of its position in the chain.

The disk read timer may be in any one of several states, with respect to the timer interrupt chain disk-read timer. The disk-read timer may have been entered directly from the TIV or the disk-read timer may have been entered from another program which supplanted the disk-read timer at the primary position. If the latter is the case, then the disk-read timer may have already reasserted itself at the primary position in the chain, or there may be another program presently occupying that position. If it is found that the disk-read timer was entered directly as a result of the timer interrupt or that the disk-read timer occupies the primary position in the timer interrupt chain, then no special action need be taken to maintain the correct position in the chain. Otherwise, the disk-read timer takes steps to reassert itself at the primary position in the timer interrupt chain as described hereinbelow.

In order to detect the state of its position in the timer interrupt chain, the disk read timer examines three parameters. First, at 26 the disk-read timer compares the actual entry point identifier, AEP, with the currently active entry point identifier, CAEP. Secondly, at both 28A an 28B the disk read timer compares the TIV with the actual entry point address or vector ("EPV").

At 28A, if the actual entry point, AEP, equals the current active entry point, CAEP, and the actual entry point address, EPV, equals the TIV, then the state of the TIV as initially set by the disk-read timer has not been altered, and the disk-read timer still holds first place in the timer interrupt chain. The disk-read timer then performs housekeeping functions at 30 for the slow (55 msec.) tick. The "propagate tick" flag is true at 32, since it was set at 24, so the tick is passed down the timer interrupt chain by retrieving the appropriated vector corresponding to the actual entry point 34 and branching through the vector at 36 which will pass program control to the next TIH in the chain, if any.

If the actual entry point, AEP, equals the current active entry point, CAEP at 26, but the actual entry point address, EPV, does not equal the TIV at 28A, then the TIV was subsequently appropriated by another program, and that the disk-read timer was not entered as direct result of a timer interrupt, but was actually passed the timer interrupt by the program that appropriated the TIV. In this case, the disk read timer appropriates the TIV back at 42 by: (1) selecting the next entry point in the EP table, (2) incrementing the index, CAEP, (3) storing the current state of the TIV in the appropriated vector table at a level corresponding to the newly selected EP, and (4) setting the TIV to point to the newly selected entry point. The disk-read timer then performs housekeeping functions at 30 for the conventional, slow (55 msec.) tick. Since the "propagate tick" flag is true at 32, the tick is passed down the timer interrupt chain by retrieving the most recent stolen vector at 34 and branching through the vector at 36, which will pass program control to the next TIH in the chain, if any. When a subsequent timer interrupt occurs, program control will be vectored to the newly selected entry point.

If the actual entry point, AEP, does not equal the current active entry point, CAEP, at 26, and the actual entry point address, EPV, does not equal the TIV, at 28B, then the disk-read timer was not entered as a direct result of a timer interrupt but, rather, was passed a timer interrupt by another program in the interrupt hierarchy. This is a situation where the disk-read timer actually occupies multiple positions in the interrupt chain including the primary priority position. Such a situation can occur when, after initially setting itself in the primary priority position, the disk-read timer was supplanted by another program and has reasserted its primary priority, as in the case described in the preceding paragraph. In such a situation, the supplanting program, even though it was itself subsequently supplanted by the disk-read timer, still thinks that it is in the primary priority position. When a timer interrupt occurs, the supplanted program is passed the interrupt, and according to accepted procedure, it then passes the interrupt to the program it had previously supplanted which, in this case, is the disk-read timer. In this case, the disk-read timer does nothing but merely pass the interrupt to the next program in the chain. The disk-read timer bypasses the housekeeping functions at 30. Since the "propagate tick" flag is true at 32, the tick is passed down the timer interrupt chain by retrieving the most recent stolen vector at 34 and branching through the vector at 36 which will pass program control to the next TIH in the chain, if any.

If the actual entry point, AEP, does not equal the current active entry point, CAEP at 26, but the actual entry point address, EPV, does equal the TIV at 28B, then the disk-read monitor has been entered as a direct result of a timer interrupt, but it was not entered via the current active entry point. In this case, the disk-read timer is still in the primary priority position. This can arise when a program which had previously stolen the TIV from the disk read timer is restoring the TIV to its former state as a prelude to the program terminating and becoming non-resident. In this case, the disk-read monitor merely changes the CAEP to point to the EPV which matches the TIV at 44. The disk-read timer then performs housekeeping functions at 30 for the slow (33 msec.) tick. Since the "propagate tick" flag is true at 32, the tick is passed down the timer interrupt chain by retrieving the most recent stolen vector at 34 and branching through the vector at 36 which will pass program control to the next TIH in the chain, if any.

At 22, if upon entry, the fast-tick flag is true, this indicates that the disk call interceptor has received a call for a disk read operation and has set the flag. The disk-read timer then undertakes at 46 to measure time by accumulating ticks. While accumulating ticks, the disk-read timer inspects specified memory addresses for changes in their respective contents from their respective initial values. For each such specified memory address, the disk-read timer will record the number of accumulated ticks if and at the time a change from the initial value occurs. The number of specified memory addresses which the disk read timer so monitors can be one address or an array of addresses. The disk-read timer records these tick counts in the shared variable memory (MI of FIG. 3). When the disk-read timer is to monitor the addresses as within the memory buffer which are to receive the data from the disk, the addresses as are obtainable from known memory locations which were set to the addresses by the disk-call interceptor since, being in the disk call chain, the disk-call interceptor has an opportunity to examine the disk call parameters and learn the buffer address. If the disk-read timer is to monitor an array of memory addresses, the array will typically be supplied by a transient program, such as the analysis program, via the shared structured memory block (M2 of FIG. 3).

By monitoring the contents of the addresses as in the read memory buffer (not shown) looking for a change in the contents, seek and rotational latency time can be eliminated from the elapsed time of the read operation. The procedure is as follows: (1) from the point it detects the fast-tick flag as true, the disk-read timer checks for a change in the contents of the addresses within the memory buffer for each tick while continuously accumulating ticks, (2) when a change in the contents is detected, the disk-read timer records the total number of ticks accumulated and continues to accumulate ticks. At some point the disk-read timer detects that the fast-tick flag is false and stops accumulating ticks. All of the sub totals of the accumulated ticks and final total of accumulated ticks are passed to the disk-call interceptor through the shared variable memory (MI of FIG. 3). With this information, the disk call interceptor can then subtract the tick count up to the change in the contents of the first address of the memory buffer from the total tick count and arrive at an adjusted tick count which more accurately reflects the actual data transfer time, and thereby eliminate any seek and rotational latency time preceding the actual transfer of the data.

If the contents of the addresses within the memory buffer do not change, then the disk-call interceptor may log that fact, which will become part of the historical data gathered by the analysis program for the particular areas of the storage read during that operation. Along with other historical data for the same areas, the analysis program will subsequently discern that as an anomaly and will treat it as such.

Another function performed by the disk read timer when the fast tick flag is set, is to differentiate every Nth tick and propagate said Nth tick down the timer interrupt chain. "N" being the factor by which the tick rate was increased by the disk-call interceptor when it detected a disk read operation. The differentiation can be done by maintaining a count of the ticks at 46 separate from the tick accumulation connected with measuring disk reads. When the count equals "N" at 48 the counter is cleared. Alternatively, a counter can be preset with a value of "N" and decremented once for each timer tick; when the counter value equals zero, the counter is reset to "N" and the tick is propagated. To conserve on the number of instructions, the disk-read timer then sets the propagate tick flag at 50 and branches to that portion of the disk read timer instruction set that tests for the presence of the propagate-tick flag at 32 and acts accordingly.

If the "propagate tick" flag is true at 32, than the tick is passed down the timer interrupt chain by retrieving the appropriated vector corresponding to the actual entry point 34 and branching through the vector at 36 which will pass program control to the next TIH in the chain, if any. If it is false the timer is restarted at 38 and the disk read timer does an interrupt return at 40 which restores program control to the interrupted program.

DISK-CALL TRAPPER

As previously discussed the disk-call trapper component of this invention creates a trap for all disk "calls" issued by the operating system.

Conventionally, when a program running under an operating system requires a disk operation (for example, to write data to a disk file or read data from the disk), it will interrupt to, or call, an operating system service routine which handles such disk I/O requests. The service routine will then determine the type of operation and set up memory buffers and other necessary parameters, and then it will call a low level disk interface routine to perform the actual operation at the hardware level. As is conventionally done during execution of a call instruction, the address of the instruction immediately following the call instruction is saved, for example in a last in, first-out memory called a "stack". When the disk operation is completed or if it is aborted, the disk interface routine will execute a return which will transfer program control back to the caller, the operating system service routine, and program execution will resume at the instruction whose address was saved during the call.

It is the function of the disk-call trapper to locate that call instruction (the previously discussed call used by the operating system to invoke the low-level disk interface routine) and determine the memory location of the call's operand. The operand is the address to which program control is transferred by the call, the address of the routine targeted by the call, i.e., the operand is a vector to the routine. Once the location of the vector is found, the disk call trapper stores the vector in another memory location and replaces it with a vector pointing to the disk-call interceptor. In this fashion, it enables the disk call interceptor to trap all the operating system's disk calls. From that point on, whenever the operating system makes a disk operation call intended for the low-level disk interface routine, it will actually be calling the disk-call interceptor. Essentially the disk call trapper makes a patch to the operating system which redirects the system's disk calls.

In a DOS environment, such as in the exemplary embodiment, the disk-call trapper preferably uses the trace mode of the CPU to locate the vector of the operating system's call to the disk interface routine. Other methods of locating this vector in other operating system environments are known in the art. In trace mode, the CPU causes a trace interrupt to occur after the execution of each instruction. The trace interrupt causes program control to be transferred to the address specified in a trace interrupt vector, and the address of the next instruction of the interrupted program is saved, e.g., pushed onto a stack. Each trace interrupt automatically disables further trace interrupts until they are re-enabled.

To locate the address of the vector through which the operating system calls the disk interface routine, the disk-call trapper uses a trace interrupt handler routine. The disk call trapper first alters the trace interrupt vector to point to the trace interrupt handler routine. It then places the CPU in trace mode and issues a disk operation request to the operating system. Preferably the disk operation requested is simply a request for status since it is a quick operation involving no reading or writing. From that point on, the operating system step-by-step sets up the disk operation through its disk operation service routine and eventually makes a call to the low-level disk interface routine.

For each trace interrupt, the trace interrupt handler looks at the address of the next instruction that will be executed when the handler returns program control back to the interrupted program. This is the address saved during the trace interrupt and can be found, e.g., in the stack. Thus, for each instruction executed in the process of providing the requested disk operation, the trace interrupt handler is able to check the address of the next instruction before it is executed.

At some point the operating system will make a call to its low-level disk interface routine. Execution of the call instruction, by definition, will cause the call return address to be stored, e.g., on the stack. The trace interrupt following execution of the call will cause the address of the next instruction to be executed to be stored also. So at that point both the next instruction to be executed and the return address of the call are stored, and available to the trace interrupt handler. A stack will contain the address of the next instruction to be executed at the last address pushed onto the stack and the call return address one level deeper. The address of the next instruction to be executed will be within a memory address range known by the disk call trapper to contain the operating system's low level I/O interface routines. In the DOS environment this is equivalent to an address of C800 hexademical or greater, because that is the range in which the BIOS (basic input/output system) resides, and in a DOS environment it is the primary function of the disk call trapper to trap the call made by DOS to the BIOS disk interface routines, commonly referred to as Interrupt 13h routines. Ranges of addresses to be searched in other operating system environments are known to those skilled in the art. The trace interrupt handler then stores the call return address that was saved, e.g., pushed onto the interrupt stack, since that is conventionally the address of the instruction just following the sought-after disk call instruction.

Program control will eventually return to the disk-call trapper (at the completion of the disk operation requested by it) and at that point, the disk-call trapper examines the contents of memory working backward (i.e., in descending address order) from the call return address stored by the trace interrupt handler until it recognizes one of the CPU call codes. The disk-call trapper then computes the address of the operand of the call according to the same procedure used by the CPU to determine the operand address for the call instruction. After computing its address, the disk call trapper then retrieves the call instruction's operand which in reality is the vector through which the operating system makes disk operation calls. The disk-call trapper then stores that vector and replaces it with a vector pointing to the disk-call interceptor. The stored operating system vector is also communicated through a memory location (see M2 in FIG. 3) to the disk-call interceptor. From that point on, whenever a program or the operating system thinks it is making a call to its low-level disk interface routine, it will actually be making a call to the disk-call interceptor When called, the disk-call interceptor will perform certain disk call processing and thereafter will execute the call that the operating system tried to make, to the low-level disk interface routine, via the appropriated operating system vector passed to it by the disk-call trapper. Program control will be returned to the disk-call interceptor when the disk operation is completed. The disk call interceptor will then make some checks and log reportable events, if any, and return program control to the operating system along with the disk status it received from the disk interface routine.

LOG FILE LOCATOR

As previously discussed, the log file locator component of this invention can be a program or a part of a program which is executed and runs under the operating system as a setup program whenever the computer system is booted. The log file locator is activated whenever the computer is initially powered up or is re-booted. In an operating system which is not re-entrant, such as DOS, the disk-call interceptor being part of a device driver which in turn is a part of the operating system, does not have access to the operating system's file management services. However, as explained herein one function of the disk-call interceptor is to record certain events in the log file on disk. Therefore, the log file locator functions to provide absolute disk file location information to the disk-call interceptor to enable the disk-call interceptor to do direct writes to the log file, these direct writes being the logging function performed by the disk-call interceptor. Another function of the disk-call interceptor is to temporarily relocate data for which an error occurrence is suspected, to a location accessible by the analysis program. Therefore, the log file locator functions to also provide absolute disk file location information to the disk-call interceptor to enable the disk call interceptor to do direct writes to a temporary location for holding recovered data.

To communicate the absolute location of the log file to the disk call interceptor and to enable the disk-call interceptor to provide information to the log file locator, a block of structured memory (see M2 in FIG. 3) is set aside for such communication. A portion of the structured memory area receives information from the disk call interceptor and can be read by the log file locator, and another portion receives information from the log file locator and can be read by the disk call interceptor. It is via this memory area that the log file locator during start up provides the disk call interceptor with the log file information. Optionally, the log file locator can also provide information for one or more additional files into which the disk-call interceptor can store data for the purpose of saving data from areas of the disk which the disk call interceptor detects as becoming marginal, as indicated above. It is also via this structured memory area that the analysis program can set the factor by which the system timer rate is increased during the disk read operations.

The log file locator finds or creates a log file on disk, e.g., sixteen sectors long, which in a presently preferred log format has the capacity to hold approximately 500 log entries. Following completion of that disk operation, the log file locator makes an operating system call to the device driver of which the disk call interceptor is a part with a "read" command. In response, the disk-call interceptor returns a pointer to the starting address of the structured memory block. Either before or after getting the pointer to the starting address of the structured memory block, the log file locator reads the log file through a disk read interrupt/call to the operating system. Since the disk-call interceptor stores the absolute disk addresses involved in at least the most recent disk read operation, in the structured memory block (M2 of FIG. 3) it will also store that information for each disk operation initiated by the log file locator. The log file locator then moves the absolute disk addresses stored by the disk-call interceptor to another part of the structured memory block where the disk call interceptor expects to find them, and sets a flag in the same memory to inform the disk call interceptor that the log file addresses are so stored and available to it. At that point the absolute disk addresses of the log file are known to the disk-call interceptor, which can thereafter log events without interfering with the operating system's file management. Without this function being performed by the log file locator, the disk-call interceptor would need to have a file management capability similar to that of the operating system. This would undesirably increase the size of the disk call interceptor.

It should be noted that all other transient components of this invention can learn the starting address of the structured memory block (M2 of FIG. 3) by calling the device driver, which comprises the disk-read timer and the disk-call interceptor, with a "read" command in response to which the device driver returns a pointer to the structured memory.

ANALYSIS PROGRAM

The analysis program functions to retrieve the information logged by the disk call interceptor in the log file and integrate that into a continuously updated history of the storage media. Thereafter, it clears the log file, leaving space for more log entries by the disk call interceptor. The analysis program also has access to data recovered by the disk-call interceptor, from sectors in which an error is detected. The recovered data and log file locations are known to the analysis program by communication with the log file locator, both of which are preferably processes within a single, transient program, as indicated above. Thus, if necessary, data recovered from a faulty sector may be relocated to a safe location, as is described hereinbelow.

The analysis program determines on the basis of the historical data whether any disk areas are defective to the point where they should be designated to the operating system as unusable, and the data relocated. Preferably, the analysis program is executed routinely in the start-up procedure or boot procedure of the computer. For computers that do not power down or re boot except occasionally, such as network file servers, the analysis program can be initiated at the option of an operator or according to a schedule invoked automatically.

If the analysis program detects that any new errors have occurred since the analysis program was last run, a procedure to confirm and correct bad locations is undertaken. An error is confirmed by a single recurrence of the error on retesting the location wherein the error occurred previously. The criterion for confirming an error is based on the published specifications for hard disk drives used in personal computers, readily available through vendor literature. If an error recurs, the location at which the error occurred is identified to the operating system as bad, and the data which had been stored there is relocated to a good location. The data which had been stored in the bad location was previously recovered to a location known to the analysis program, by the disk-call interceptor. If the error does not recur, the history for that location is checked to determine if the error is part of a pattern of intermittent errors at that location. If so, the location is identified to the operating system as bad and the data relocated as was done for a recurring error. If a non recurring error occurs for a location that has no history of errors, then the error is considered to be spurious, and the location is still considered good. Therefore, the data which had been stored there is returned to that location.

Finally, the historical pattern of errors may be analyzed by an expert system which is part of the analysis program. The expert system determines whether the current pattern of errors indicates a potential catastrophic failure of the disk drive. For example, significant numbers of errors near the inner radius of the storage surface may indicate a fault in the read/write system, while significant numbers of errors near the outer radius of the storage surface may indicate imminent spindle bearing failure. Failures in these systems would be catastrophic, if they occurred with no warning. However, they are problems which qenerally cannot be fixed by the computer owner or user. Therefore, a warning is issued to the user, so that appropriate action may be taken, such as backing up the entire hard disk and taking the machine to a repair facility, where the hard disk might be replaced.

DISK-CALL INTERCEPTOR

The disk call interceptor has been previously discussed in part, in connection with its interaction with the other components of this invention. Its primary function is to log all information which indicates a media failure or potential media failure. Coincidentally with logging information which indicates actual or potential media failures, the disk call interceptor temporarily relocates data recovered from a location which caused a log entry to a location which is known to the analysis program. That is, recovered data is written to a sector whose physical address is known to both the disk-call interceptor and the analysis program through the action of the log file locator, as previously discussed. Thus, the analysis program may write the data back to the location from which it was recovered or to a new location, as required by the analysis described hereinbefore.

The disk call interceptor obtains some failure or potential failure information from the timing information provided to it by the disk read timer, but besides timing information concerning read operations, other loggable information concerning read problems is available in status information return by the disk interface routine at the end of the read operation. For example, if erroneous data read from the disk can be corrected by the disk controller using an error correction code (ECC), the fact that the data has been so corrected is typically provided in the end-of operation status information. However, operating systems such as DOS, with which the low-level disk interface routines (i.e., the BIOS, under DOS) respectively communicate do not pass that information on to the program which requested the read operation. To capture this information, this system must have access to the status information in raw form, i.e., before information is stripped away by the operating system.

Thus, to get at this raw status information, the disk-call interceptor is interposed between the disk interface routine and other programs. To do this, it requires help from the disk call trapper as hereinbefore described in the section describing the disk-call trapper. Briefly, the disk-call trapper places the disk call interceptor in the disk call chain between programs requesting disk operations and the low-level disk interface routine. Its position in the disk call chain ensures that the disk-call interceptor will be passed program control at some point during the initiation process of all disk operations, and at some point during the passing back of program control and status information at the end of all disk operations.

Each time the disk call interceptor receives program control, it deciphers the call and determines whether the cell is a read operation or another kind of operation. If it is a read operation, it sets the fast tick flag which the disk read timer uses to distinguish between disk read operations and other operations. It then accelerates the system timer rate by a factor of "N", preferably $N=32$, by loading the system timer down counter with its normal count divided by N. Thereafter system timer interrupts will occur at a rate N times the normal rate. For example if the normal period between timer interrupts is 55 msec, the disk-call interceptor will reduce the period between interrupts to 55/N msecs. After completion of the things that need to be done each time a disk operation is initiated, the disk call interceptor then passes the disk call down to the next program entity in the disk call chain.

Figure 7:
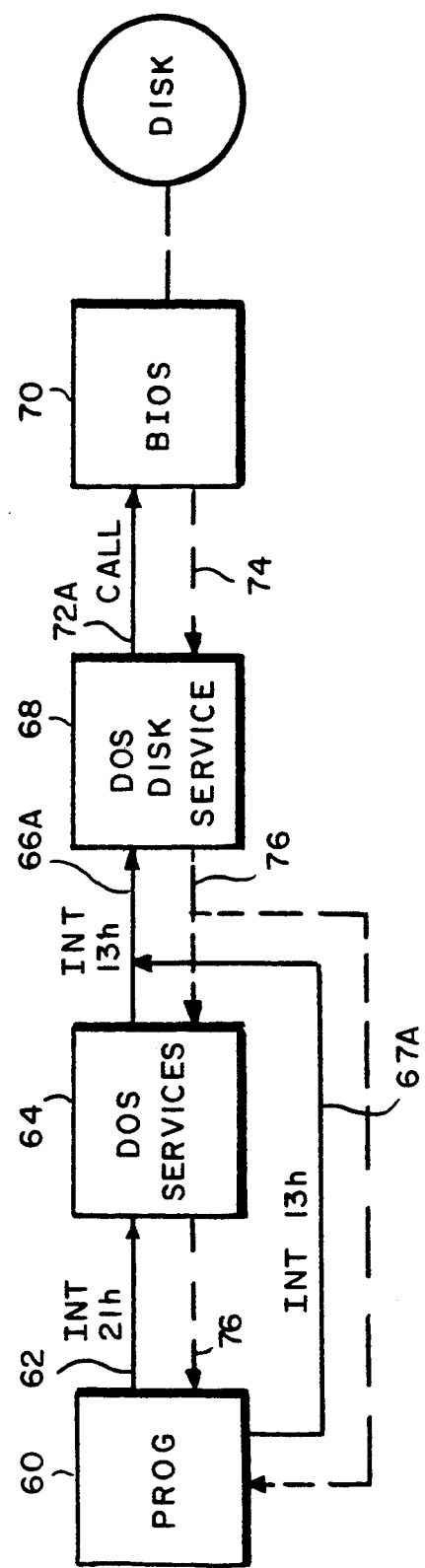
FIG. 7 is a functional block diagram illustrating program control flow in a DOS disk call chain without this invention present.
Figure 8:
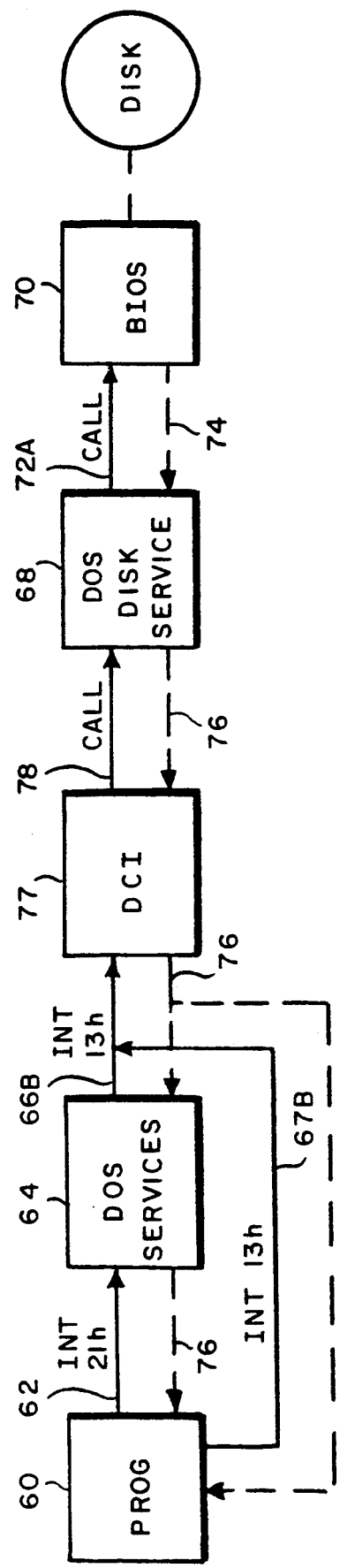
FIG. 8 is a functional block diagram illustrating program control flow in a DOS disk call chain of which a disk call interceptor component of this invention is a part.
Figure 9:
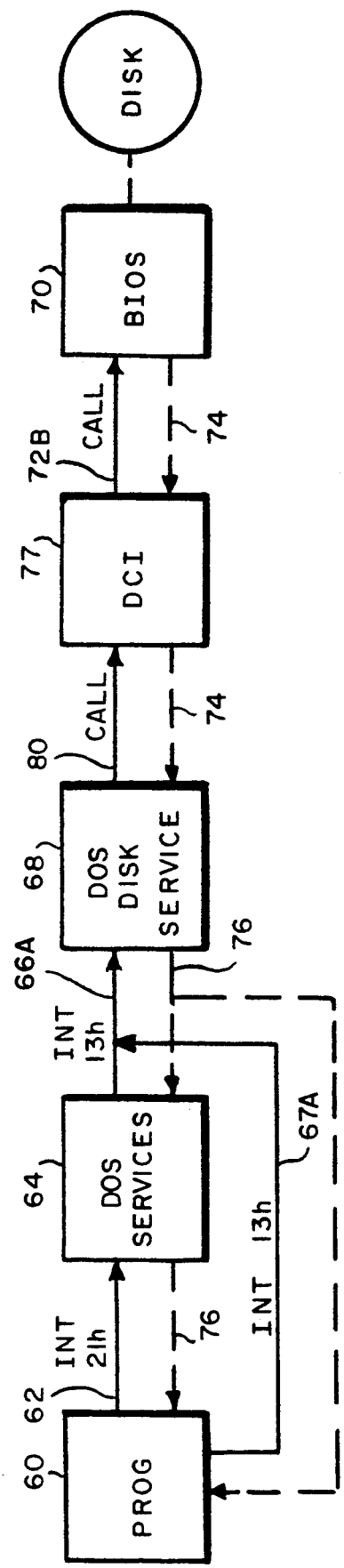
FIG. 9 is a second functional block diagram illustrating program control flow in a DOS disk call chain of which a disk-call interceptor component of this invention is a part.

The program control hierarchy in the disk call chain is now described with reference to FIGS. 7-9. In FIG. 7 conventional program control flow between program entities in a DOS disk call chain during a disk operation call is illustrated. The solid lines indicate program control flow during the initiation process of the disk operation, and the dashed lines represent the passing back of status information (and program control) at the end of the disk operation. FIGS. 8 and 9 also illustrate program control and status flow as in FIG. 7, but with the added program entity, disk call interceptor, in their respectively illustrated disk call chains. Although FIGS. 7-9 show DOS environment disk call chains, it should be noted that the inventions disclosed in these illustrations and the related text are not limited to DOS environments, and no limitations in the claims as to environment should be construed therefrom, since other environments are known in the art wherein the invention may be practiced.

Referring again to FIG. 7, a program 60 running under an operating system such as DOS requests a disk operation. Under DOS this can be done by executing a software interrupt having a hexadecimal code of 21 ("INT 21H") which passes program control via path 62 to a portion of DOS commonly referred to as "DOS Services" 64 which does the initial processing of such requests. Program control is passed via an INT 21h vector When DOS Services gets control, it in turn sets up and makes a software interrupt call ("INT 13h") via path 66A to a portion of DOS which handles disk calls which can be referred to as "DOS Disk service" 68. Appropriate parameters are also passed along. The program 60 can also make an INT 13h call to DOS Disk Service directly via path 67A.

DOS Disk Service then starts the disk operation by executing a call instruction to the appropriate low-level disk interface routine located in the system BIOS 70, which call transfers program control to the called BIOS routine via path 72A. The called BIOS routine starts and handles the disk operation at the hardware level. At the conclusion of the disk operation, the BIOS starts a return of program control back up the disk call chain which eventually returns to the originating program 60, and as it is transferred backward, status information is transferred along with it.

The status information 74 returned by the BIOS to DOS Disk Service is the previously discussed raw status, but the status 76 returned by DOS Disk Service has been filtered. In particular, status bits which indicate that an ECC data correction has taken place are masked by the DOS Disk Service and are unavailable to any program entity further up the disk call chain.

Referring to FIGS. 8 and 9, the disk-call chain of FIG. 7 has been modified by the insertion of the program entity disk call interceptor 77 into their respective chains. In the chain of FIG. 8, the initiation of a disk operation by a disk request from program 60 proceeds as described in FIG. 7 except that both INT 13h interrupt calls from DOS Services and from the program, 66B and 67B respectively, result in a transfer of program control to the disk-call interceptor rather than to DOS Disk Service. The placement of the disk-call interceptor in the chain at this position is the result of the disk-call trapper appropriating the INT 13h vector and replacing it with a vector pointing to the disk-call interceptor component. At this position in the chain, the disk call interceptor can examine the parameters of the disk request initiated by the program 60 and determine if it is a read operation. If it is, it sets the fast-tick flag for the disk-read timer as previously discussed and makes a call to DOS Disk Service via path 78. From that point on, the passing of the disk call forward in the chain proceeds as described for FIG. 7.

Referring again to FIG. 8, a significant disadvantage of the disk call interceptor being at the position in the chain as illustrated, is that the only end-of operation status information 76 it receives is from DOS Disk Service after the EEC information has been masked.

Referring to FIG. 9, the disk call interceptor 77 is illustrated as being in a position in the chain advanced from its position as illustrated in FIG. 8. In this illustration, it is functionally between DOS Disk Service and the BIOS. The disk-call interceptor was placed in this position by the action of the disk call trapper as previously discussed. At this position in the chain, the disk-call interceptor can examine the parameters of the disk request initiated by the program 60 and determine if it is a read operation. If it is, it sets the fast-tick flag for the disk-read timer as previously discussed. Also, in this position the disk call interceptor function in passing the disk call forward involves receiving the call by DOS Disk Service via path 80, which call was intended for the BIOS but which now transfers program control to the disk-call interceptor, and forwarding the call to the BIOS via path 72B.

It should be noted that with respect to receiving the timing information from the disk read timer and making appropriate entries in the log file, either position in the disk call chain as illustrated in FIGS. 8 and 9 is acceptable. However, to obtain the additional and very significant information contained in the raw status information it is more advantageous to be positioned in the disk call chain as illustrated in FIG. 9.

In order to determine from the raw time information received by the disk call interceptor from the disk-read timer, whether an error condition has occurred, the disk call interceptor must compare the raw time information with a table of acceptable times. Such a table may be built up at setup time, for example, by performing several series of successive reads of one sector, then two sectors, then three sectors, up to 255 sectors, and logging in the table the average times for each of these read operations. Thus, when the operating system issues a call for a read operation containing one of those numbers of sectors stored in the table, a simple comparison can determine if a reasonable time has been taken for the read. The criteria for making the determination can be established by the user; for example only, a "reasonable time" may be defined as one which is no more than one standard deviation greater than the mean, or no more than fifty-percent greater than the mean.

Since there are spurious events which may occur during normal disk operations, that can cause a read operation to take longer than normal, retesting, as discussed in connection with the analysis program is performed. For example, controller overhead may vary, spurious resets of a controller or drive may occur, and timing granularity problems may cause false high readings. However, retesting eliminates the majority of these errors.

The foregoing description and drawings were given for illustrative purposes and by way of example only, it being understood that the invention is not limited to the embodiments disclosed, but is intended to embrace any and all alternatives, equivalents, modifications and rearrangements of elements falling within the scope of the invention as defined by the appended claims. For example, without limitation, the timer which supplies the clock ticks for timing disk read operations need not be the system timer; another available timer may be used, or a supplemental timer added. If a timer other than the system timer, or a second timer, is used, then instead of providing means for accelerating the system timer, means should be provided for selecting between the available timers. If the system timer operates fast enough conventionally to provide during a disk read operation "ticks" at a fast enough rate to resolve adequately the latency in the read seek operation, no other timer is required and no speeding up of the timer is required. The timer may operate at a rate other than that illustrated, as well. As hard disks are rotated at higher speeds, for example, a more rapid timer is needed. In general, the timer should supply at least 5-10 "ticks" per disk rotation. If the disk speed is unknown, then as a preliminary matter, disk speed (or timer speed relative to the disk) must be established. so that the timer rate can be set. Another possibility is to incorporate into hardware parts of the system disclosed herein as implemented in software.

Moreover, the techniques disclosed herein may be used in conjunction with operations other than disk read operations, to discriminate errors and faults on the basis of time required for operation completion. Also, the techniques for forcing to the top of an interrupt chain the interrupt handling for a particular application may be used with other applications, as well, Other modifications and uses of the disclosed techniques and embodiments will be readily apparent to those skilled in the art.

We claim:

1. An apparatus for locating and anticipating media failures in a data storage device capable of storing data on a rotating medium in a plurality of storage locations and which is responsive to a request to retrieve data from the medium to perform an operation for retrieving at least a portion of the data from the rotating storage medium, comprising:
   a timer which provides timing information; and
   a disk call interceptor which intercepts requests to retrieve data from the medium, and which determines, in response to an interception of a request to retrieve data from the rotating storage medium, an elapsed time of the operation performed for retrieving the data from the rotating storage medium using the timing information, and which includes means for determining, from the elapsed time for the operation performed, whether an error condition occurred during the operation, by comparing the elapsed time to an elapsed time for one or more previously performed operations for retrieving data from the rotating storage medium.

2. The apparatus of claim 1 wherein the timer is a programmable timer which generates timer interrupts at a first rate for use by a system resource which expects interrupts at said first rate, wherein the disk call interceptor includes:
   detecting means for detecting the start of an operation for retrieving data from the data storage device,
   means, responsive to said detecting means detecting the start of an operation for retrieving data, for programming the timer to generate interrupts at a second rate which is increased from the first rate by a predetermined factor, and
   means for accumulating timer interrupts at the second rate during the data retrieval operation.

3. The apparatus of claim 2 wherein the timer is a system timer in a computer.

4. The apparatus of claim 2, wherein the data storage peripheral device includes means for applying an error correcting code to data read during an operation for retrieving data and means for providing an indication of whether the error correcting code was applied to obtain correct data during the operation, the apparatus further comprising:
   means for determining from the indication of whether the error correcting code was applied to obtain correct read data, whether an error condition occurred during the operation for retrieving data.

5. The apparatus of claim 2, wherein the apparatus is embodied in a computer which includes a timer interrupt handler, the apparatus further comprising:
   means for intercepting timer interrupts occurring at the second rate, and for providing interrupts to the timer interrupt handler at the first rate.

6. The apparatus of claim 5, further comprising:
   means for logging information concerning each operation for retrieving data during which an error condition occurred, the information including the location on the medium from which data was retrieved.

7. The apparatus of claim 6, further comprising:
   means for reorganizing the logged information, from an organization based upon operations for retrieving data to an historical organization based upon locations.

8. The apparatus of claim 7, further comprising:
   means for determining from the historical organization of logged information whether there are any locations on the medium of the data storage device that are defective,
   means for indicating to the computer that such locations are defective, and
   means for relocating any data stored in said indicated defective locations to other locations on the data storage device which are not defective.

9. The apparatus of claim 2, further comprising:
   means for logging information concerning each operation for retrieving data during which an error condition occurred, the information including the location on the medium from which data was retrieved.

10. The apparatus of claim 9, further comprising:
    means for reorganizing the logged information, from an organization based upon operations for retrieving data to an historical organization based upon locations.

11. The apparatus of claim 10, further comprising:
    means for determining from the historical organization of logged information whether there are any locations on the medium of the data storage device that are defective,
    means for indicating to the computer that such locations are defective, and
    means for relocating any data stored in said indicated defective locations to other locations on the data storage device which are not defective.

12. The apparatus of claim 1, wherein the timer generates timer interrupts at a rate sufficient to provide several timer interrupts per each rotation of said medium during an operation for retrieving data from said medium, and wherein the disk call interceptor includes:
    means for accumulating timer interrupts during the operation for retrieving data.

13. The apparatus of claim 12 wherein the timer is a system timer in a computer.

14. The apparatus of claim 12, wherein the data storage device includes means for applying an error correcting code to data read during an operation for retrieving data and means for providing an indication of whether the error correcting code was applied to obtain correct data during the operation, the apparatus further comprising:

means for determining from the indication of whether the error correcting code was applied to obtain correct read data, whether an error condition occurred during the operation for retrieving data.

15. The apparatus of claim 14, further comprising:
means for logging information concerning each operation for retrieving data during which an error condition occurred, the information including the location on the medium from which data was retrieved.

16. The apparatus of claim 15, further comprising:
means for reorganizing the logged information, from an organization based upon operations for retrieving data to an historical organization based upon locations.

17. The apparatus of claim 16, further comprising:
means for determining from the historical organization of logged information whether there are any locations on the medium of the data storage device that are defective,
means for indicating to the computer that such locations are defective, and
means for relocating any data stored in said indicated defective locations to other locations on the data storage device which are not defective.

18. The apparatus of claim 12, further comprising:
means for logging information concerning each operation for retrieving data during which an error condition occurred, the information including the location on the medium from which data was retrieved.

19. The apparatus of claim 18, further comprising:
means for reorganizing the logged information, from an organization based upon operations for retrieving data to an historical organization based upon locations.

20. The apparatus of claim 19, further comprising:
means for determining from the historical organization of logged information whether there are any locations on the medium of the data storage device that are defective,
means for indicating to the computer that such locations are defective, and
means for relocating any data stored in said indicated defective locations to other locations on the data storage device which are not defective.

21. The apparatus of claim 1 wherein the apparatus is embodied in a computer which includes means for controlling execution of an operation for retrieving data from the medium responsive to a corresponding request for data from the medium, and
wherein the disk call interceptor is adapted to intercept a request, to the means for controlling, for data from the medium and is responsive to the start of the corresponding operation for retrieving data from the medium to time the operation.

22. The apparatus of claim 21 further including an operating system for controlling request to the means for controlling and wherein the disk call interceptor is interposed between the operating system and the means for controlling.

23. The apparatus of claim 1 further including a central processing unit for executing an application program, which may request data from the medium during execution, and for issuing, responsive any request for data issued during execution of said application program, said request to retrieve data from the medium.

24. The apparatus of claim 1 wherein the disk call interceptor includes:
means for determining an acceptable time limit for the retrieval of the requested data independently of whether an error condition is otherwise reported, and
means for comparing the elapsed time of the operation to the acceptable time limit for the retrieval and for signaling an occurrence of a possible error when the elapsed time exceeds the acceptable time limit.

25. The apparatus of claim 24 further including:
means responsive to the signaling of a possible error to request a retry of the operation for retrieving data from the medium; and
means for comparing the original elapsed time of the operation to the elapsed time of the retrial of the operation and for signalling an occurrence of an error condition if both the original elapsed time and the elapsed time of the retrial exceed the acceptable time limit.

26. The apparatus of claim 24 wherein the means for determining an acceptable time limit includes means for retrieving an acceptable time limit from a memory containing a table of acceptable time limits, wherein the table is accessed according to the amount of data whose retrieval is requested in the operation.

27. The apparatus of claim 1 wherein the data storage device has a corresponding read buffer, having at least first and last storage locations, for temporarily storing data during an operation for retrieving data from the data storage device and wherein the disk call interceptor includes
means for detecting a change in the data stored in the first storage location of the read buffer, and for timing the operation after such a detection until detecting a change in the data stored in the last storage location of the read buffer.

28. The apparatus of claim 1, wherein the data storage device includes means for applying an error correcting code to data read during an operation for retrieving data and means for providing an indication of whether the error correcting code (ECC) was applied to obtain correct data during the operation, the system further comprising:
means for determining from the indication of whether the ECC was applied to obtain correct read data, whether an error condition occurred during the operation for retrieving data.

29. The apparatus of claim 28, further comprising:
means for logging information concerning each operation for retrieving data during which an error condition occurred, the information including the location on the medium from which data was retrieved.

30. The apparatus of claim 29, further comprising:
means for reorganizing the logged information, from an organization based upon operations for retrieving data to an historical organization based upon locations.

31. The apparatus of claim 30, further comprising:
means for determining from the historical organization of logged information whether there are any locations on the medium of the data storage device that are defective,
means for indicating to the computer that such locations are defective, and means for relocating any data stored in said indicated defective locations to other locations on the data storage device which are not defective.

32. A method for locating and anticipating media failures in a data storage device capable of storing data on a rotating storage medium in a plurality of storage locations and which are responsive to a request to retrieve data from the rotating storage medium to perform an operation for retrieving at least a portion of the data from the rotating storage medium, comprising the steps of:
provide a source of timing information;
intercepting a request to retrieve data from the rotating storage medium;
determining, in response to an interception of a request, an elapsed time of the operation performed for retrieving the data from the rotating storage medium using the timing information; and
determining from the elapsed time for the operation performed, whether an error condition occurred during the operation, by comparing the elapsed time to an elapsed time for one or more previously performed operation for retrieving data from the rotation storage medium.

33. The method of claim 32, wherein the step of providing a source of timing information includes providing a programmable timer which generates timer interrupts at a first rate for use by a system resource which expects interrupts at said first rate, wherein the step of timing includes the steps of:
programming the timer, in response to the start of an operation for retrieving data, to generate interrupts at a second rate increased from the first rate by a predetermined factor, and
accumulating timer interrupts at the second rate during the operation for retrieving data.

34. The method of claim 33 wherein the step of programming the timer includes a step of programming a system timer in a computer.

35. The method of claim 34, wherein the computer also includes a timer interrupt handler, and the method further includes the steps of:
intercepting timer interrupts occurring at the second rate, and providing interrupts to the timer interrupt handler at the first rate.

36. The method of claim 33, wherein the data storage device also may apply an error correction code to data read during an operation for retrieving data and provides an indication of whether the error correcting code was applied to obtain correct data during the operation, and the method further includes the step of:
determining from the indication of whether the error correcting code was applied to obtain correct read data, whether an error condition occurred during the operation for retrieving data.

37. The method of claim 36, further comprising the step of:
logging information concerning each operation for retrieving data during which an error condition occurred, the information including the location on the medium from which data was retrieved.

38. The method of claim 37, further comprising the step of:
reorganizing the logged information, from an organization based upon operations for retrieving data to an historical organization based upon locations.

39. The method of claim 38, further comprising the steps of:
determining from the historical organization of logged information whether there are any locations on the medium of the data storage device that are defective,
indicating to the computer that such locations are defective, and
relocating any data stored in said indicated defective locations to other locations on the data storage device which are not defective.

40. The method of claim 22, further comprising the step of:
logging information concerning each operation for retrieving data during which an error condition occurred, the information including the location on the medium from which data was retrieved.

41. The method of claim 40, further comprising the step of:
reorganizing the logged information, from an organization based upon operations for retrieving data to an historical organization based upon locations.

42. The method of claim 41, further comprising the steps of:
determining from the historical organization of logged information whether there are any locations on the medium of the data storage device that are defective,
indicating to the computer that such locations are defective, and
relocating any data stored i said indicated defective locations to other location on the data storage device which are not defective.

43. The method of claim 32 wherein the source of timing information provided is a timer which generates timer interrupts at a rate sufficient to provide several timer interrupts per each rotation of said medium during an operation for retrieving data from said medium, and wherein the step of timing includes the step of:
accumulating timer interrupts during the operation for retrieving data.

44. The method of claim 43 wherein the step of programing the timer includes the step of programming a system timer in a computer.

45. The method of claim 43, wherein the data storage device may apply an error correcting code to data read during an operation for retrieving data and provides an indication of whether the error correcting code was applied to obtain correct data during the operation, the method further comprising the step of:
determining from the indication of whether the error correcting code was applied to obtain correct read data, whether an error condition occurred during the operation for retrieving data.

46. The method of claim 45, further comprising the step of:
logging information concerning each operation for retrieving data during which an error condition occurred, the information including the location on the medium from which data was retrieved.

47. The method of claim 46, further comprising the step of:
reorganizing the logged information, from an organization based upon operations for retrieving data to an historical organization based upon locations.

48. The method of claim 47, further comprising the step of:
determining from the historical organization of logged information whether there are any locations on the data storage device that are defective, indicating to the computer that such locations are defective, and relocating any data stored in said indicated defective locations to other locations on the data storage device that are not defective.

49. The method of claim 43, further comprising the step of:

logging information concerning each operation for retrieving data during which an error condition occurred, the information including the location on the medium from which data was retrieved.

50. The method of claim 49, further comprising the step of:

reorganizing the logged information, from an organization based upon operations for retrieving data to an historical organization based upon locations.

51. The method of claim 50, further comprising the steps of:

determining from the historical organization of logged information whether there are any locations on the data storage device that are defective, indicating to the computer that such locations are defective, and relocating any data stored in said indicated defective locations to other locations on the data storage device which are not defective.

52. The method of claim 32 for use in conjunction with a computer which includes a means for controlling execution of an operation for retrieving data from the medium responsive to a corresponding request for data from the medium, and wherein the step of intercepting includes intercepting a request to the means for controlling.

53. The method of claim 52 wherein the computer includes an operating system for controlling requests to the means for controlling and wherein the step of intercepting includes the step of intercepting requests between the operating system and the means for controlling.

54. The method of claim 32 used in conjunction with a central processing unit for executing an application program, which may request data from the medium during execution, and for issuing, responsive any request for data issued during execution of said application program, said request to retrieve data from the medium.

55. The method of claim 32 where in the step of determining whether an error condition occurred includes the steps of:

determining an acceptable time limit for the retrieval of the requested data independently of whether an error condition is otherwise reported, comparing the elapsed time of the operation to the acceptable time limit for the retrieval, and signaling an occurrence of a possible error when the elapsed time exceeds the acceptable time limit.

56. The method of claim 55 further including the steps of:

responsive to the signaling of a possible error, requesting a retry of the operation for retrieving data from the medium;

comparing the original elapsed time of the operation to the elapsed time of the retrial of the operation; and signalling an occurrence of an error condition if both the original elapsed tim and the elapsed time of the retrial exceed the acceptable time limit.

57. The method of claim 55 wherein the step of determining an acceptable time limit includes the step of retrieving an acceptable time limit from a memory containing a table of acceptable time limits, wherein the table is accessed according to the amount of data whose retrieval is requested in the operation.

58. The method of claim 32 wherein the data storage device has a corresponding read buffer, having at least first and last storage locations, for temporarily storing data during an operation for retrieving data from the data storage device and wherein the step of timing includes detecting a change in the data stored in the first storage location of the read buffer, and timing the operation after such a detection until detecting a change in the data stored in the last storage location of the read buffer.

59. The method of claim 32, wherein the data storage device also may apply an error correction code (ECC) to data read during an operation for retrieving data and provides an indication of whether the ECC was applied to obtain correct data during the operation, and the method further includes the step of:

determining from the indication of whether the ECC was applied to obtain correct read data, whether an error condition occurred during the operation for retrieving data.

60. The method of claim 59, further comprising the step of:

logging information concerning each operation for retrieving data during which an error condition occurred, the information including the location on the medium from which data was retrieved.

61. The method of claim 60, further comprising the step of:

reorganizing the logged information, from an organization based upon operations for retrieving data to an historical organization based upon locations.

62. The method of claim 61, further comprising the steps of:

determining from the historical organization of logged information whether there are any locations on the data storage device that are defective, indicating to the computer that such locations are defective, and relocating any data stored in said indicated defective locations to other locations on the data storage device which are not detective.

* * * * *